(12) United States Patent
Tijerina

(10) Patent No.: US 10,274,198 B2
(45) Date of Patent: Apr. 30, 2019

(54) HANDHELD COMPUTER CASE HAVING INTEGRAL LIGHTER

(71) Applicant: Luis Tijerina, Odessa, TX (US)

(72) Inventor: Luis Tijerina, Odessa, TX (US)

(*) Notice: Subject to any disclaimer, the term of this patent is extended or adjusted under 35 U.S.C. 154(b) by 720 days.

(21) Appl. No.: 15/018,980

(22) Filed: Feb. 9, 2016

(65) Prior Publication Data

US 2017/0227219 A1    Aug. 10, 2017

(51) Int. Cl.
| | | |
|---|---|---|
| *F23Q 7/16* | (2006.01) |
| *F23Q 7/22* | (2006.01) |
| *H04B 1/3888* | (2015.01) |
| *H01L 31/04* | (2014.01) |
| *F23Q 7/14* | (2006.01) |

(52) U.S. Cl.
CPC .............. *F23Q 7/16* (2013.01); *H01L 31/04* (2013.01); *H04B 1/3888* (2013.01); *F23Q 7/14* (2013.01); *F23Q 7/22* (2013.01)

(58) Field of Classification Search
CPC ..... F23Q 7/16; F23Q 7/14; F23Q 7/22; F23Q 7/00; F23Q 7/18; F23Q 7/24; F23Q 2/32; F23Q 2/36; H01L 31/04; H04B 1/3888; H04M 1/21; G06F 1/181
See application file for complete search history.

(56) References Cited

U.S. PATENT DOCUMENTS

| | | | |
|---|---|---|---|
| 7,160,104 B2 | 1/2007 | Faber | |
| 7,373,183 B2 | 5/2008 | Brudos | |
| 8,014,822 B1 | 9/2011 | Murray et al. | |
| 9,641,208 B2 * | 5/2017 | Sela | H04B 1/3888 |
| 2005/0245282 A1 | 11/2005 | Brudos | |
| 2013/0220847 A1 * | 8/2013 | Fisher | B65D 25/005 206/216 |
| 2014/0076879 A1 | 3/2014 | Ye et al. | |

* cited by examiner

*Primary Examiner* — David J Walczak
(74) *Attorney, Agent, or Firm* — The Keys Law Firm PLLC

(57) ABSTRACT

A handheld computer case having an integral lighter for providing a flameless lighter in a case for a mobile phone includes a case body defining a rigid housing sized to fit a conventional handheld computer, a lighter actuator for selectively availing and activating an electric lighter, and a lighter housing in which the electric lighter is disposed. In operation, a user may apply manual force to mechanically actuate the lighter actuator, thereby causing both the lighter housing to open and expose the electric lighter and an electrical switch to direct electricity from an internal battery to a heating element which defines the electric lighter. Once the user is finished with the lighter, the manual force may be removed to cause the lighter housing to automatically close and the flow of electricity to the heating element to be interrupted.

20 Claims, 2 Drawing Sheets

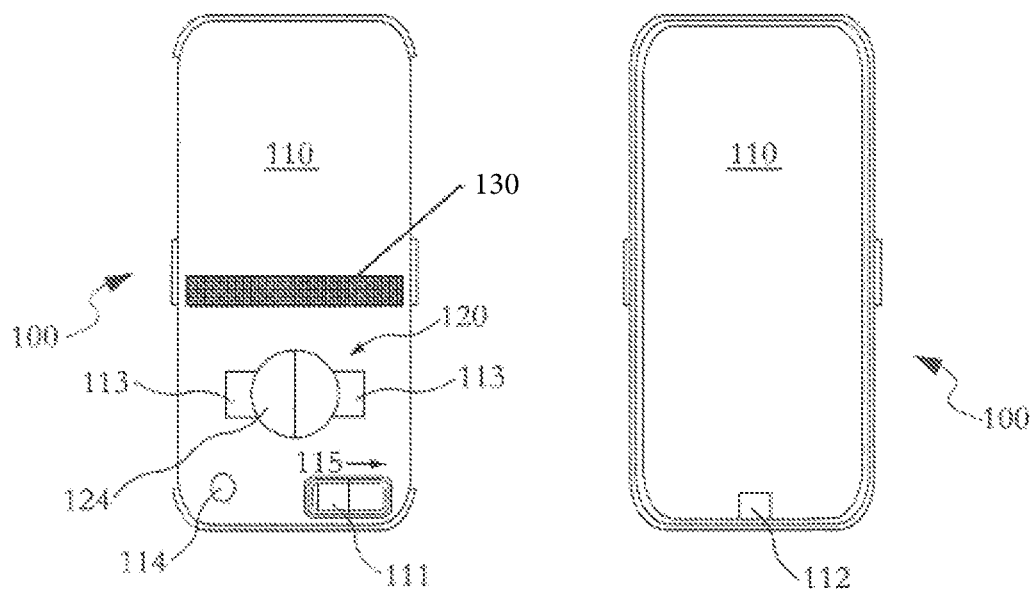
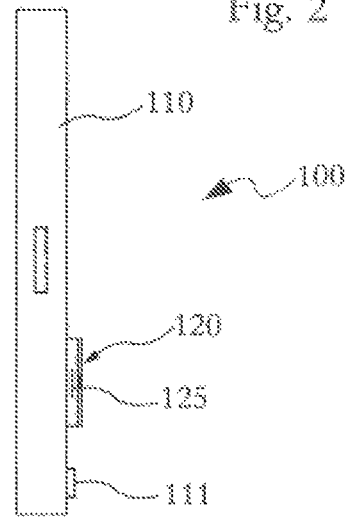

HANDHELD COMPUTER CASE HAVING INTEGRAL LIGHTER

BACKGROUND OF THE INVENTION

Field of the Invention

This invention relates generally to handheld computer accessories and, more particularly, to a handheld electronic communications device having a built in lighter.

Description of the Prior Art

The use of conventional protective and/or functional cases for handheld computers, such as mobile phones, is well known. There remains a need, however, for a handheld computer case having an integral lighter which would eliminate the need for a user to carry both their mobile device and a separate lighter. It would be helpful if such a handheld computer case having an integral lighter employed a flameless heating element to ignite items such as a cigarette. It would be additionally desirable for such a handheld computer case having an integral lighter included an internal rechargeable power source so as to not require the use of electricity stored by the accompanying handheld computer (in the case).

The Applicant's invention described herein provides for a handheld computer case having an integral lighter adapted to allow a user to direct electricity to an integrated heating element so as to provide an electric lighter. The primary components in Applicant's a handheld computer case having an integral lighter are a case body, a sliding actuator, an electrical switch, a heating element, an internal battery, and an electrical port. When in operation, the handheld computer case having an integral lighter enables the inclusion of a flameless heating element suitable to light a cigarette into an otherwise conventional handheld computer case. As a result, many of the limitations imposed by prior art structures are removed.

SUMMARY OF THE INVENTION

A handheld computer case having an integral lighter for providing a flameless lighter in a case for a mobile phone. The handheld computer case having an integral lighter comprises a case body defining a rigid housing sized to fit a conventional handheld computer, a lighter actuator for selectively availing and activating an electric lighter, and a lighter housing in which the electric lighter is disposed. In operation, a user may apply manual force to mechanically actuate the lighter actuator, thereby causing both the lighter housing to open and expose the electric lighter and an electrical switch to direct electricity from an internal battery to a heating element which defines the electric lighter. The electricity passing through the heating element causes it to heat up sufficiently to the point that it can be used to ignite a cigarette or other object. Once the user is finished with the lighter, the manual force may be removed to cause the lighter housing to automatically close and the flow of electricity to the heating element to be interrupted.

It is an object of this invention to provide a handheld computer case having an integral lighter which would eliminate the need for a user to carry both their mobile device and a separate lighter.

It is another object of this invention to provide a handheld computer case having an integral lighter which employs a flameless heating element to ignite items such as a cigarette.

It is yet another object of this invention to provide a handheld computer case having an integral lighter which includes an internal rechargeable power source so as to not require the use of electricity stored by the accompanying handheld computer.

These and other objects will be apparent to one of skill in the art.

BRIEF DESCRIPTION OF THE DRAWINGS

FIG. 1 is a rear elevational view of a handheld computer case having an integral lighter built in accordance with the present invention in a base position.

FIG. 2 is a front elevational view of a handheld computer case having an integral lighter built in accordance with the present invention.

FIG. 3 is a side elevational view of a handheld computer case having an integral lighter built in accordance with the present invention in a base position.

DETAILED DESCRIPTION OF THE INVENTION

Figure 4:
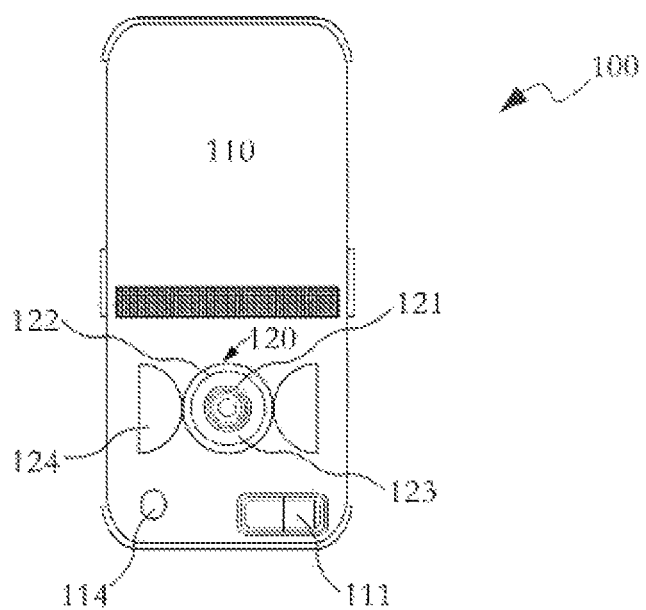
FIG. 4 is a rear elevational view of a handheld computer case having an integral lighter built in accordance with the present invention in a lighting position.

Referring now to the drawings and in particular FIGS. 1, 2, 3, and 4, a handheld computer case having an integral lighter (or "lighter case") 100 is shown having a case body 110 which externally has lighter actuator defining a spring biased sliding actuator 111, an electrical port 112, and a lighter housing 120. The case body 110 defines a rigid housing sized to fit a conventional handheld computer, such as a mobile phone.

The lighter housing 120 defines an insulated enclosure which includes a heating element 121 positioned therein. In the preferred embodiment, the heating element 121 is positioned inside the lighter housing 120 inside of an insulating ring 122, on top of an insulating floor 123, and underneath a movable door 124.

Internally, the case body 110 includes an electrical switch which is coupled to the sliding actuator 111 and an internal battery, with the electrical switch, battery, heating element 121 and electrical port 112 all electrically interconnected to one another.

In the preferred embodiment, the lighter housing 120 defines a selectively openable enclosure that is constructed out of a material with low thermal conductivity. In one embodiment, the non electrical components of the lighter housing 120 (i.e. everything by the heating element 121 and its electrical wiring) are constructed out of silica aerogel. In addition, in some embodiments, a exhaust aperture 125 is disposed one or both sides of the lighter housing 120, with each exhaust aperture 125 having an accompanying insulator strip 113 on the back of the case body 110 so as to prevent heated air exiting the lighter housing 120 from the exhaust aperture 125 from overheating a phone (not shown) in the integral lighter case 100 or the integral lighter case 100 itself.

In one embodiment, moveable door 124 defines a pair of flip open panels which are selectively hinged between a base position in which they are positioned over the heating element and a lighting position in which they flipped over to expose the heating element by way of mechanical actuation of the sliding actuator 111.

In the preferred embodiment, the heating element 121 defines a portion of nichrome wire that is wired to the internal battery and the electrical switch such that electricity from the internal battery can be selectively supplied to the nichrome wire through the electrical switch.

In operation, a user may use manual force to mechanically actuate the sliding actuator 111 by sliding it in a lighting direction 115. This causes both the moveable door 124 to be moved from the base position to the lighting position and the electrical switch to direct electricity from the internal battery to the heating element 121. Similar to conventional flameless lighters, the electricity passing through the heating element 121 causes it to heat up sufficiently to the point that it can be used to ignite a cigarette or other object. The sliding actuator 111 is spring biased to remain in the base position, so once the manual force in the lighting direction 115 supplied by the user is removed, the sliding actuator 111 returns to the base position and causes the movable door 124 to close and the electrical switch to interrupt the flow of electricity to the heating element 121.

In the preferred embodiment, the sliding actuator 111 is mechanically connected to movable doors 124 through a lever so that the manual force that moves the sliding actuator is transferred to the movable doors 124 to cause them to open (and the biasing of the sliding actuator 111 will cause the movable doors 124 to automatically close when the sliding actuator 111 is released).

In the preferred embodiment, the electrical port 112 defines a USB port which in which a USB connector can be plugged so that electricity can be supplied to recharge the internal battery.

In one embodiment, the case body 110 includes a battery status indicator light 114 which provides a flashing notification when the charge state of the internal battery becomes low.

In one embodiment, the case body 110 additionally includes a solar panel 130 which is electrically connected to the internal battery (and a charge controller) to allow the internal battery to be recharged through solar power.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A handheld computer case having an integral lighter, comprising:
    a case body defining a housing sized to fit a handheld computer, wherein said case body includes an internal battery electrically connected to an electrical switch;
    a lighter housing integral with the case body, wherein said lighter housing includes an electrically operated heating element which is electrically connected to said electrical switch and an insulating floor, with the heating element position on top of the insulating floor in the lighter housing such that the insulating floor is situated between the heating element and a portion of the case body in which the handheld computer fits; and
    a lighter actuator integral with the case body and operatively connected the electrical switch, wherein said lighter actuator is configured to selectively cause the electrical switch to direct electricity from the internal battery through the heating element and interrupt the flow of electricity through the heating element.

2. The handheld computer case having an integral lighter of claim 1, wherein said lighter housing includes a movable door selectively movable between a base position in which the heating element is covered and a lighting position in which the heating element is exposed and at least one exhaust aperture configured to allow heated air to exit the lighter housing even while the movable door is in the base position.

3. The handheld computer case having an integral lighter of claim 2, wherein said movable door defines at least one panel operative to hinge between the base position and the lighting position.

4. The handheld computer case having an integral lighter of claim 2, wherein the lighter actuator is configured to cause the movable door to move to the lighting position whenever causing the electrical switch to direct electricity from the internal battery through the heating element.

5. The handheld computer case having an integral lighter of claim 4, wherein the lighter actuator is spring biased to maintain the movable door in the base position and interrupt the flow of electricity through the heating element in the absence of manual actuation.

6. The handheld computer case having an integral lighter of claim 2, wherein said movable door is constructed of a material having a low thermal conductivity and said at least one exhaust aperture is positioned adjacent to an insulator strip positioned on the back of the case body that is adapted to prevent heated air exiting said lighter housing from said at least one exhaust aperture from overheating the handheld computer in the case body.

7. The handheld computer case having an integral lighter of claim 1, wherein said case body includes an electrical port that is electrically connected to the internal battery, thereby enabling electricity from an external source to be supplied to the internal battery.

8. The handheld computer case having an integral lighter of claim 1, wherein said case body includes a solar panel that is electrically connected to the internal battery, thereby enabling electricity generated from light to be supplied to the internal battery.

9. The handheld computer case having an integral lighter of claim 1, wherein said case body includes an indicator light that is electrically connected to the internal battery and adapted to provide a visual notification related to the internal battery.

10. The handheld computer case having an integral lighter of claim 1, wherein said heating element is constructed of a nichrome wire.

11. A handheld computer case having an integral lighter, comprising:
    a case body defining a housing sized to fit a handheld computer, wherein said case body includes an internal battery electrically connected to an electrical switch;
    a lighter housing integral with the case body, wherein said lighter housing defines an insulated enclosure that protrudes from the case body and has a movable door and said lighter housing includes an electrically operated heating element and an insulating floor positioned therein, with the heating element position on top of the insulating floor in the lighter housing such that the insulating floor is situated between the heating element and a portion of the case body in which the handheld computer fits;
    said heating element being electrically connected to said electrical switch and said movable door selectively movable between a base position in which the heating element is covered and a lighting position in which the heating element is exposed; and
    a lighter actuator integral with the case body and operatively connected the electrical switch, wherein said lighter actuator is configured to selectively cause the electrical switch to direct electricity from the internal battery through the heating element and interrupt the flow of electricity through the heating element.

12. The handheld computer case having an integral lighter of claim 11, wherein said lighter housing includes at least one exhaust aperture configured to allow heated air to exit the lighter housing even while the movable door is in the base position.

13. The handheld computer case having an integral lighter of claim 12, wherein said case body includes at least one insulator strip positioned thereon, situated under said at least one exhaust aperture and adapted to prevent heated air exiting said lighter housing from said at least one exhaust aperture from overheating the handheld computer in the case body.

14. The handheld computer case having an integral lighter of claim 11, wherein said movable door defines at least one panel operative to hinge between the base position and the lighting position.

15. The handheld computer case having an integral lighter of claim 11, wherein the lighter actuator is configured to cause the movable door to move to the lighting position whenever causing the electrical switch to direct electricity from the internal battery through the heating element.

16. The handheld computer case having an integral lighter of claim 15, wherein the lighter actuator is spring biased to maintain the movable door in the base position and interrupt the flow of electricity through the heating element in the absence of manual actuation.

17. The handheld computer case having an integral lighter of claim 11, wherein the insulated enclosure which defines the lighter housing is constructed of a material having a low thermal conductivity.

18. The handheld computer case having an integral lighter of claim 11, wherein said case body includes at least one of an electrical port that is electrically connected to the internal battery, thereby enabling electricity from an external source to be supplied to the internal battery, and a solar panel that is electrically connected to the internal battery, thereby enabling electricity generated from light to be supplied to the internal battery.

19. The handheld computer case having an integral lighter of claim 11, wherein said case body includes an indicator light that is electrically connected to the internal battery and adapted to provide a visual notification related to the internal battery.

20. The handheld computer case having an integral lighter of claim 11, wherein said heating element is constructed of a nichrome wire.

* * * * *